United States Patent

Maeda et al.

[11] Patent Number: 5,858,100
[45] Date of Patent: Jan. 12, 1999

[54] SUBSTRATE HOLDER AND REACTION APPARATUS

[75] Inventors: Kazuo Maeda; Kouichi Ohira; Yuhko Nishimoto, all of Tokyo, Japan

[73] Assignees: Semiconductor Process Co., Ltd.; Canon Sales Co., Inc.; Alcan-Tech Co., Inc., all of, Japan

[21] Appl. No.: 416,006

[22] Filed: Apr. 4, 1995

[30] Foreign Application Priority Data

Apr. 6, 1994 [JP] Japan .................................. 6-068794

[51] Int. Cl.⁶ .................................................. C23C 16/00
[52] U.S. Cl. ...................... 118/719; 118/715; 118/723 I; 118/723 IR; 118/728
[58] Field of Search ................... 118/728, 715, 118/719, 723 I, 723 IR

[56] References Cited

U.S. PATENT DOCUMENTS

| | | | |
|---|---|---|---|
| 4,990,229 | 2/1991 | Campbell et al. | 204/298.06 |
| 5,084,125 | 1/1992 | Nobuo et al. | |
| 5,277,751 | 1/1994 | Ogle | 118/723 I |
| 5,460,684 | 10/1995 | Saeki | 118/728 |

FOREIGN PATENT DOCUMENTS

| | | |
|---|---|---|
| 446657 | 9/1991 | European Pat. Off. |
| 493089 | 7/1992 | European Pat. Off. |
| 506391 | 9/1992 | European Pat. Off. |
| 4229161 | 1/1992 | Germany |
| 59-124140 | 11/1984 | Japan |
| 368773 | 3/1991 | Japan |
| 3-276717 | 12/1991 | Japan |
| 4358074 | 5/1993 | Japan |
| 2229454 | 9/1990 | United Kingdom |
| 9210308 | 6/1992 | WIPO |

OTHER PUBLICATIONS

Patent Abstracts of Japan, vol. 13, No. 7 (63–282261).
Patent Abstracts of Japan, vol. 11, No. 190 (62–020321).
Patent Abstracts of Japan, vol. 13, No. 134 (63–297568).
Patent Abstracts of Japan, vol. 95, No. 1 (6–280028).

*Primary Examiner*—Richard Bueker
*Attorney, Agent, or Firm*—Lorusso & Loud

[57] ABSTRACT

The present invention relates to a reaction apparatus for receiving a reaction gas and for heating a substrate so as to form a film such as an insulating film on the substrate or for etching, with reduced power consumption for heating the substrate. The apparatus can change a substrate temperature within a short period of time, and maintains throughput while reducing labor and cost for maintenance. The apparatus includes a substrate holder (12) with a base of an insulating material in which an electrode (22) and a heater (23) for heating the held substrate (20) are contained. The apparatus also includes a processing chamber (7) enclosed by a chamber wall (7*a*).

16 Claims, 6 Drawing Sheets

SUBSTRATE HOLDER AND REACTION APPARATUS

BACKGROUND OF THE INVENTION

1. Field of the Invention

The present invention relates to a substrate holder and to a reaction apparatus for forming a film or etching the same, more specifically, to an apparatus that forms an insulating film or the like by using reaction gas and heating a substrate or performs etching, and a substrate holder for holding a substrate to be processed.

2. Description of the Prior Art

A CVD apparatus is a useful apparatus in forming a $SiO_2$ film, a PSG film, a BSG film, a BPSG film, a $Si_3N_4$ film, an amorphous Si film, a polycrystalline Si film, a W film, a Mo film, a $WSi_2$ film, a $MoSi_2$ film, an Al film or the like in manufacture of a semiconductor device.

Conventional CVD apparatus is classified by its means for activating reaction gas as follows:

① thermal CVD apparatus,
② light-assisted CVD apparatus, and
③ plasma-assisted CVD apparatus.

The thermal CVD apparatus has heating means for supplying heat energy to activate the reaction gas, and is classified either as a low pressure type or a normal pressure type, depending on the pressure employed. Further, the apparatus is classified as a low temperature type or a high temperature type depending on the substrate temperature, and furthermore, is classified as a resistance type, an induction heating type or a lamp heating type, depending on the heating means. Further, it is classified as a hot wall type or a cold wall type, depending on the location of installation of the heating means.

A light-assisted CVD apparatus includes light irradiation means for supplying energy to reaction gas so as to active the reaction gas by irradiating the reaction gas with ultraviolet rays, and is able to form a film under low pressure or high pressure and at a low temperature.

A plasma-assisted CVD apparatus uses plasma generating means for activating reaction gas directly or indirectly using AC power or a magnetic field, and the plasma is generally generated under low pressure and at a low temperature. The plasma-assisted CVD apparatus is classified, depending on the plasma generating means, as a parallel plate type for activating reaction gas directly by radiation of high-frequency power or an ECR type for supplying energy to electrons by high-frequency power and a magnetic field and activating the reaction gas indirectly with these electrons.

An etching apparatus, in particular a dry etching apparatus, is a useful apparatus for manufacturing a semiconductor device in case of precise etching of a $SiO_2$ film, a PSG film, a BSG film, a BPSG film, a $Si_3N_4$ film, an amorphous Si film, a polycrystalline Si film, a W film, a Mo film, a $WSi_2$ film, a $MoSi_2$ film, an Al film or the like, and is classified in a manner similar to the CVD apparatus described above.

In the CVD apparatus and the etching apparatus described above, a substrate holder for fixing a substrate to be processed is provided with a mechanical chuck, a vacuum chuck or an electrostatic chuck.

Since only a substrate and its vicinity are heated in a cold wall type apparatus for manufacturing a semiconductor, it provides the advantage that the reaction is localized, thus preventing reaction products from adhering to an inner wall of the reaction chamber. The heating mans is provided below the substrate holder in the form of an RF electrode or the like.

In the case of the cold wall type, the substrate on the substrate holder is heated through an RF electrode or the like. Thus, although there is the advantage that the large thermal capacity of the RF electrode resists fluctuation of the substrate temperature once attained, a large amount of electric power is consumed in heating the substrate. Further, when it is desired to change the substrate temperature, the substrate holder cannot be brought to the new temperature in a short period of time and requires a long time until the substrate temperature is stabilized at the new temperature.

Furthermore, since reaction products are produced within the apparatus for forming a film and the etching apparatus described above, they adhere to the inner wall of the reaction chamber as particles or the like. Accordingly, it is required that these reaction products be periodically removed. As a result, the throughput is decreased and a great amount of labor and cost are required.

SUMMARY OF THE INVENTION

It is an object of the present invention to provide a substrate holder and a reaction apparatus capable of reducing power consumption for heating a substrate, changing the substrate temperature in a short period of time, preventing a lowering of the throughput, and reducing labor and cost for maintenance.

In a substrate holder according to the present invention, an electrode of an electrostatic chuck and heating means are formed within a common insulator body (base of the substrate holder). Therefore, only the base of the substrate holder or the electrode of the electrostatic chuck lie between the held substrate and the heating means. Since the thermal capacity of the base of the substrate holder or the electrode of the electrostatic chuck is small, it is possible to reduce power consumption for heating the substrate, and further to change and stabilize the substrate temperature in a short period of time.

Further, by use of an electrostatic chuck for fixing the substrate it is possible to use the substrate holder even in a reduced pressure, unlike the vacuum chuck. Furthermore, while in a mechanical chuck the substrate is subject to damage when the substrate is fixed by something like a clip or to holding marks left on the substrate surface, such problems are avoided by use of an electrostatic chuck. Further, mounting and demounting of the substrate is easier as compared with the mechanical chuck.

Accordingly, the reaction apparatus of the present invention employs the above-mentioned electrostatic substrate holder. Therefore, it is possible to process the substrate at a reduced pressure, and to more easily mount and demount the substrate. Further, it is possible to save power and improve throughput.

Further, the processing chamber has a double wall structure composed of a chamber wall and a protective wall, and it is possible to remove the protective wall from the chamber, and to replace it with a new one as occasion demands.

Accordingly, when reaction products adhere to the inside surface of the protective wall, the interior of the processing portion is brought back to atmospheric pressure, and the protective wall is removed by moving the chamber upward by elevating means such as a lift. The removed protective wall is cleaned so as to remove reaction products that have adhered to it. Furthermore, it is possible to continue operation of the processing portion during cleaning of the protective wall by setting another protective wall in place of the removed protective wall.

Further, it is possible to enlarge the area of contact between the reaction products and the protective wall by providing an uneven surface on the protective wall so as to increase the adhesion, and to thereby prevent the reaction products that adhere to the protective wall during the period between replacements from peeling off.

Furthermore, it is possible to move the substrate holder up and down so as to maintain an appropriate space between a gas introducing implement installed above the substrate and the substrate by separating the protective wall into an upper protective wall and a lower protective wall and making it possible to move them up and down, respectively.

With this invention, it is not required to suspend operation of the apparatus for a long period of time for cleaning the inside of the processing chamber, thus making it possible to improve throughput and to reduce labor and cost required for maintenance.

DESCRIPTION OF THE PREFERRED EMBODIMENTS

Next, an embodiment of the present invention will be described with reference to the drawings.

(1) The reaction apparatus (A) A CVD apparatus

Figure 1A:
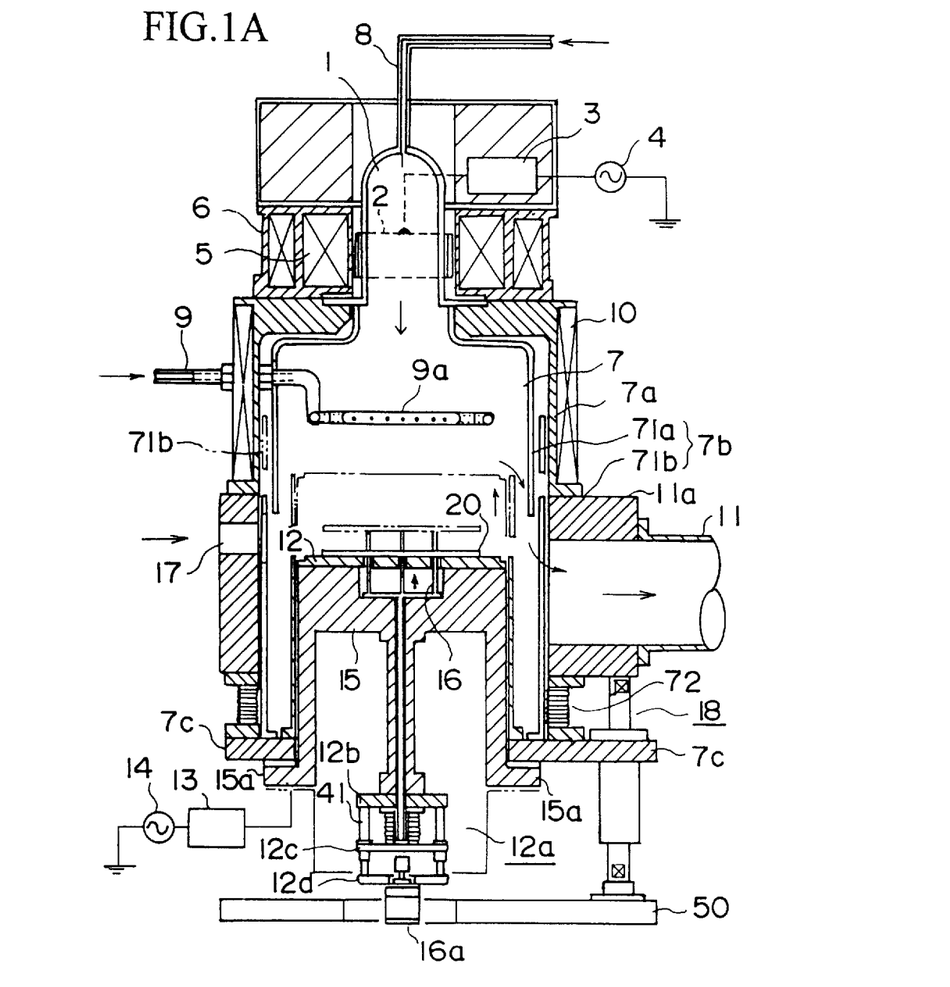
FIG. 1A is a side view showing the whole structure of a CVD apparatus using plasma in a helicon mode according to an embodiment of the present invention.

FIG. 1A is a side view showing the overall structure of a CVD apparatus, according to an embodiment of the present invention, using plasma in a helicon mode.

In FIG. 1A, a plasma generating chamber 1 is isolated from the outside by a quartz dome having a cylindrical form 15 cm in diameter×25 cm in length. The plasma activates a first reaction gas such as $Ar+O_2$ introduced through a first reaction gas introducing pipe 8. The first reaction gas introducing pipe 8 is connected to the top of the plasma generating chamber 1 and is arranged so that a gas exhaust nozzle of the first reaction gas introducing pipe 8 is centrally positioned in the plasma generating chamber 1 for introduction of the reaction gas into the plasma generating chamber 1.

Figure 2:
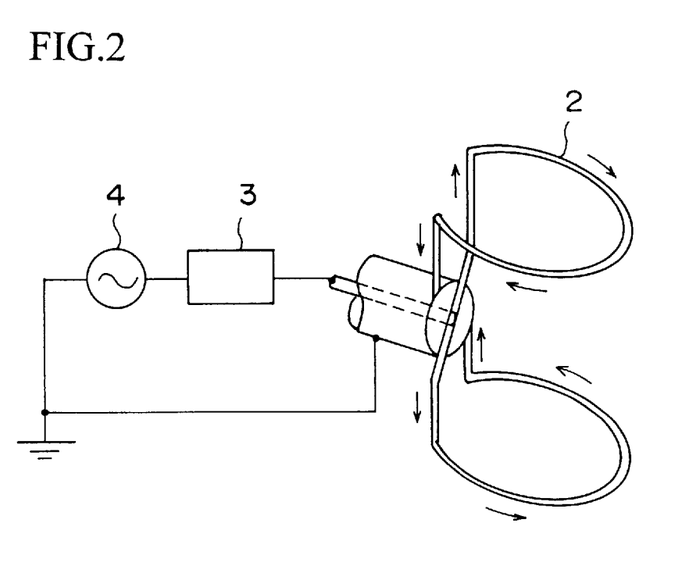
FIG. 2 is a perspective view showing detailed structure of an external antenna in a CVD apparatus using plasma in a helicon mode according to an embodiment of the present invention.

An external antenna 2, fitted around the plasma generating chamber 1, consists of two ring-shaped conductors run around the periphery of the upper part and the lower part of the cylindrical plasma generating chamber 1 with a predetermined spacing. The space between two ring-shaped conductors is important for determining the nature of the helicon wave, i.e. plasma density. An example of the configuration of the external antenna 2 is shown in FIG. 2. In this case, RF currents are passed through the two ring-shaped conductors in opposite directions, respectively, thus forming a helicon wave in a zero mode. It is also possible to form a helicon wave in a higher-order mode by changing the configuration of the external antenna.

A matching network 3 is connected to the external antenna 2, and 4 represents an RF power source for supplying RF power at a frequency of 13.56 MHz to the external antenna 2 through the matching network 3. The RF power serves as an energy source for generating the plasma.

A cylindrical inner source solenoid 5 and a cylindrical outer source solenoid 6, provided around the inner source solenoid 5, form a magnetic field extending axially through the plasma generating chamber 1. Such a magnetic field forms a helicon wave, necessary for adjusting the plasma density.

The foregoing describes the structure of the plasma generating chamber 1 and peripheral components required for generating plasma of high density ($10^{12}$ cm$^{-3}$ or higher) in a helicon mode. In particular, the RF power, the magnetic field and the space between the two ring-shaped conductors of the external antenna 2 described above represent important parameters for generating plasma.

A film-forming chamber (a processing chamber), that is isolated from the outside by means of a cylindrical housing 7a of 30 cm in diameter×22.5 cm in length, is connected to the downstream end of the plasma generating chamber 1. Bellows 72 allow for free expansion and contraction, and connect to a seal portion 7c.

The plasma in a helicon mode formed from the first reaction gas chamber 1 is supplied into the film-forming chamber 7, and a second reaction gas such as $SiH_4$ gas is also introduced into the film-forming chamber 7 through a second reaction gas introducing pipe 9.

The second reaction gas introducing pipe 9 has a gas discharge portion 9a composed of a ring-shaped quartz pipe approximately 20 cm in diameter, and a plurality of gas discharge holes, for discharging reaction gas onto a wafer 20, are formed in the quartz pipe. The second reaction gas introducing pipe 9 is arranged at a predetermined distance above the wafer 20.

Further, the film-forming chamber 7 has a double wall structure composed of a chamber wall 7a and a protective wall 7b. A detailed description of the structure thereof follows.

A chamber solenoid 10 composed of a cylindrical permanent magnet is provided around the film-forming chamber 7 to apply an appropriate magnetic field to the film-forming chamber 7. The plasma is introduced into the film-forming chamber 7 from the plasma generating chamber 1, and the flow configuration of the plasma is adjusted by chamber solenoid 10.

An exhaust port 11 is connected to an exhaust unit for exhausting unreacted and spent reaction gas and for reducing pressure in the plasma generating chamber 1 and the film-forming chamber 7. The exhaust port 11 is provided in the film-forming chamber 7.

A wafer holder 12 (a substrate holder) is provided in the lower part of the film-forming chamber 7 for placing the wafer 20 thereon, and an electrostatic chuck for fixing the wafer 20 electrostatically by applying a voltage and a heater for heating the wafer 20 are contained in a common insulating base. Further, the wafer holder is made to move up and down by means of an elevating mechanism 12a. The detailed structure of the wafer holder 12 is later described herein.

Next, the elevating mechanism 12a of the wafer holder 12 will be described with reference to FIG. 4.

Figure 4:
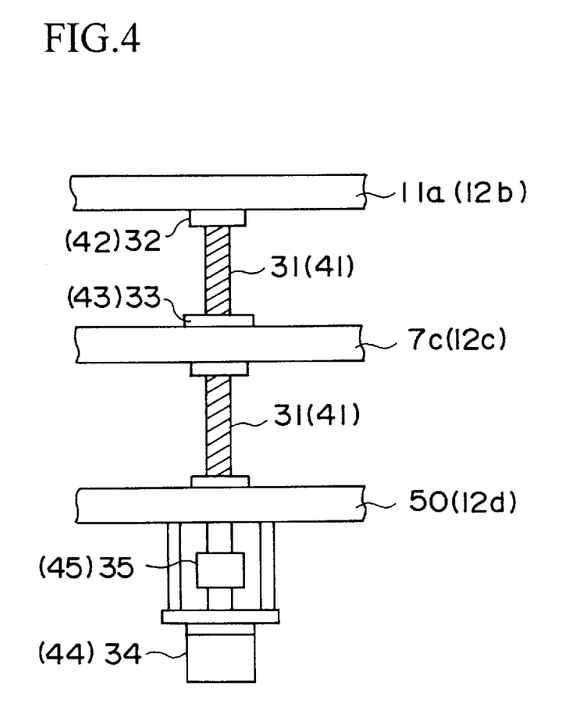
FIG. 4 is a side view showing detailed structure of an elevating mechanism of a chamber lift and a wafer holder according to an embodiment of the present invention.

In FIG. 4, 41 represents a ball screw for supporting a support plate 12b through a bearing support 42, and a thread spirally running around a shaft is formed on the ball screw 41. Further, 43 represents a ball nut provided on a fixed plate 12c, which is engaged with the thread of the ball screw 41 so as to support the ball screw 41. The ball screw 41 is rotated to move it up and down.

A 5-phase stepping motor 44 is connected to the ball screw 41 through a helical coupling 45. The helical coupling 45 transmits the torque of the stepping motor 44 to the ball screw 41 by means of two helical gears.

The ball screw 41 is rotated by the stepping motor 44, to thereby move the wafer holder 12 up and down through the support plate 12b and an RF electrode 15. At this time, the bellows 72 provided between the chamber wall 7a and the seal portion 7c expand and contract, thus maintaining the interior of the film-forming chamber 7 in a reduced pressure state.

An RF electrode 15 is provided in contact with the wafer holder 12 under the wafer holder 12, and an RF power source 14, for supplying electric power having a frequency of 13.56 MHz or 100 KHz, is connected through a matching network 13. By applying electric power having a frequency of 13.56 MHz or 100 KHz to the wafer 20, negative self-bias D.C. voltage is applied to the wafer 20, thus optimizing film properties such as the density and the stress in the formed film.

A wafer lift pin 16, extends through the RF electrode 15 and a through hole of the wafer holder 12 and is moved by elevating means 16a, and pushes the wafer 20 up to separate the wafer 20 from the surface of the wafer holder 12. Then, the separated wafer 20 is held by a wafer conveyor or the like not shown and taken out through a wafer carrying-in/carrying-out port 17.

A chamber lift 18 (elevating means) supports a flange 11a of the exhaust port 11, moves the chamber 7a of the film-forming portion 7 upward through the flange 11a and back down to its original position. Although the chamber lift 18 is shown on one side only in the figure, it is also normally provided on the opposing side for the purpose of supporting the chamber 7a in a balanced manner.

50 represents a floor on which the chamber lift 18 and the CVD apparatus are installed.

According to a CVD apparatus embodiment of the present invention, since the wafer holder 12 contains a heater and an electrostatic chuck internally, it is possible to form a film on the wafer 20 at a reduced pressure, and mounting and demounting of the wafer are made easy. Further, it is possible to save power and improve the throughput.

(B) Description of the wafer holder.

Figure 3A:
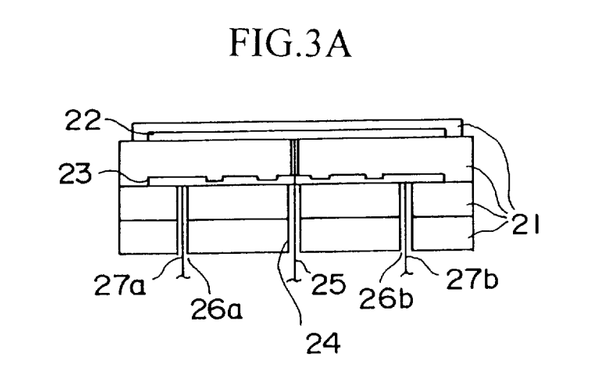
FIG. 3A is a sectional view showing details of a wafer holder according to an embodiment of the present invention.

FIG. 3A shows details of the wafer holder 12 according to an embodiment of the present invention. The upper figure is a sectional view taken along a line A—A in a plan view thereunder.

In FIG. 3A, 21 represents a wafer holder base composed of disc-shaped alumina ceramic or SiC, 22 represents a planar electrode for an electrostatic chuck buried in the upper portion of the wafer holder base 21. The electrode 22 may be tungsten (W), molybdenum (Mo) or platinum (Pt). A heater coil 23 (heating means) is electrically separated from the electrode 22 and is buried within the wafer holder base 21 under the electrode 22. A through hole 24 is provided in the wafer holder base 21 for accommodating a lead wire 25 connected to the electrode 22 and leading out under the wafer holder 12. Through holes 26a and 26b are provided in the wafer holder base 21 for connecting lead wires 27a and 27b to the heater coil 23 from under the wafer holder 12.

Figure 3B:
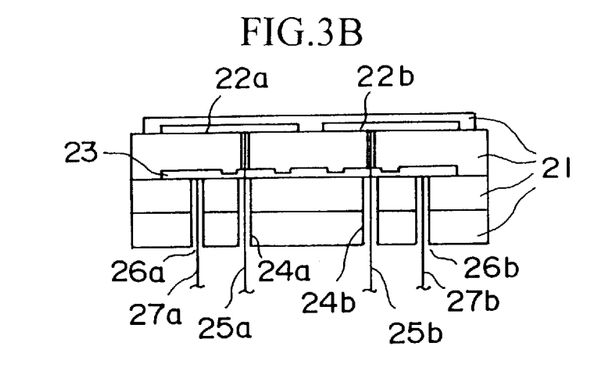
FIG. 3B is a sectional view showing details of another wafer holder according to an embodiment of the present invention.
Figure 3C:
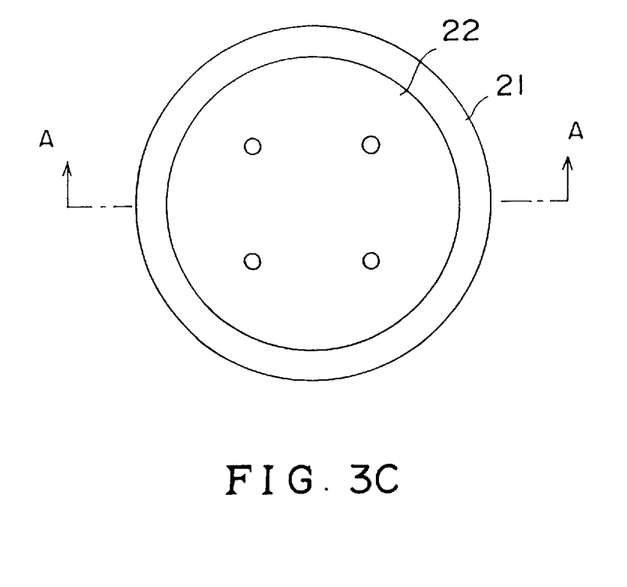
FIG. 3C is a planar view of the wafer holder of FIG. 3A.

The electrostatic chuck is, for example, a single pole type composed of one electrode 22 as shown in FIG. 3A or a bipolar type composed of two separate electrodes as shown in FIG. 3B.

Figure 3D:
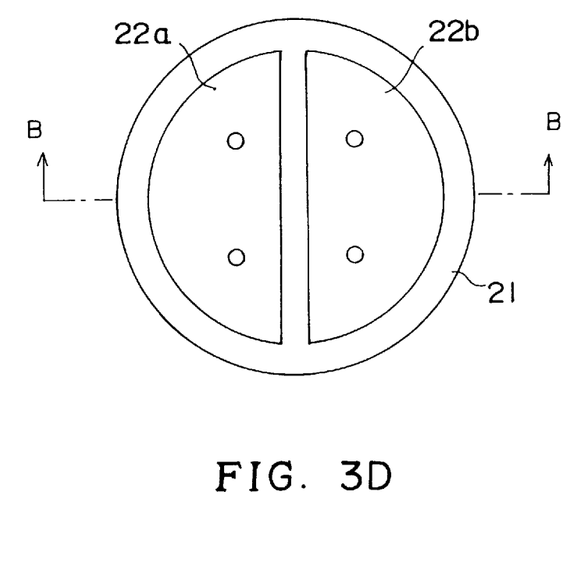
FIG. 3D is a planar view of the wafer holder of FIG. 3B.

In FIG. 3B, the upper figure is a sectional view taken along a line B—B in the plan view thereunder. In FIG. 3B, the same reference numerals in FIG. 3A indicate components which are the same as those shown in FIG. 3A, and reference numerals 24a and 24b represent through holes provided in the base 21 for connecting lead wires 25a and 25b to electrodes 22a and 22b of the electrostatic chuck, respectively, from under the wafer holder 12.

Next, the operation of the electrostatic chuck having a single pole type electrode as shown in FIG. 3A and a heater will be described.

First, the wafer 20 on which a film is to be formed is placed on the upper surface of the wafer holder 12. Then, the elevating mechanism 12a is operated so as to move the RF electrode 15 upward, and an appropriate space is maintained between the wafer holder 12 and the gas discharge portion 9a of the second reaction gas introducing pipe 9.

Then, D.C. voltage at 750V, for example, is applied to the electrode 22 of the electrostatic chuck through the lead wire 25. Since positive charges are supplied to the electrode 22 of the electrostatic chuck, negative charges are induced on the wafer 20 by means of electrostatic induction. As a result, the wafer 20 is attracted toward the electrode 22 by columbic attraction and fixed there.

Further, A.C. power including a voltage component of approximately 220V, for example, is applied to the heater coil 23 through the lead wires 27a and 27b. Heat is generated in the heater coil 23 by the supply of electric power, and conducted through the base 21 by thermal conduction so as to heat the wafer 20.

It requires approximately two hours, for example, for the temperature to rise from room temperature to 450° C. and to become stabilized, and it requires approximately one hour for the temperature to fall from 450° C. to the room temperature. The time required for temperature rise is greatly shortened as compared with that in the past.

When the temperature is stabilized, film-formation is commenced.

Thereafter, when film-formation is completed and the wafer 20 is taken out, supply of electric power to the heater coil 23 is kept as is, application of voltage to the electrostatic chuck is suspended, electrostatic attraction is released, and the wafer 20 is thereafter pushed upward by means of the wafer lift pin 16. Since the wafer 20 is thus separated from the wafer holder 12, the wafer 20 is held by a wafer conveyor or the like and is carried out through the wafer carrying-in/carrying-out port 17. If necessary, supply of electric power to the heater coil 23 may be suspended.

As described above, the electrode 22 of the electrostatic chuck and the heater coil 23 are buried in an insulator in the wafer holder according to an embodiment of the present invention. Therefore, the wafer 20 and the heater coil 23 have only the ceramic of the wafer holder 12 and the electrode 22 of the electrostatic chuck therebetween. Since the thermal capacity of ceramic and the electrode 22 of the electrostatic chuck is small, it is possible to reduce power consumption for heating the wafer 20 and to change and stabilize the temperature of the wafer 20 in a short period of time.

Further, an electrostatic chuck can be used even when a film is formed on the wafer 20 in a reduced pressure, thereby differing from a vacuum chuck. Furthermore, the wafer is susceptible to damage or holding marks left on the wafer surface when the wafer is fixed with something like clip in a mechanical chuck, while a use of an electrostatic chuck prevents such problems. Further, mounting and demounting of the wafer 20 is more easily accomplished as compared with a mechanical chuck.

(C) The film-forming chamber

In FIG. 1A, the film-forming chamber 7 is enclosed by the chamber wall 7a composed of quartz or a metal such as aluminum, and it is possible to reduce the pressure within the film-forming chamber 7. Namely, the RF electrode 15 on which the wafer holder 12 is placed is provided in the lower part of the film-forming chamber 7, and a hook-shaped seal portion 15a formed as one body with the RF electrode 15 and a seal portion 7c formed in the lower part of the chamber 7a are joined together through an insulator, to thereby hermetically seal the film-forming chamber 7. Furthermore, the bellows 72 allowing for free expansion and contraction are provided between the chamber wall 7a and the seal portion 7c. With this arrangement, when the wafer holder 12 is moved up and down, the bellows 72 expand and contract, thus making it possible to maintain the inside of the film-forming chamber 7 in a reduced pressure state.

Further, a cylindrical protective wall 7b is provided along the inner wall of the chamber 7a. The upper part of the chamber wall 7a connects with the plasma generating chamber 1, and the lower part of the chamber wall 7a connects with the seal portion 7c. Quartz is used as the material of the protective wall 7b, but alumina, that is excellent in etching-proof performance, may be used when an etching gas is used as the reaction gas.

Furthermore, it is possible to remove the protective wall 7b from the chamber 7a. In case of necessity, it is possible to replace the wall 7b with a new protective wall he protective wall 7b is separated into an upper protective wall 71a and a lower protective wall 71b, which are formed of quartz or the like and have different diameters. For example, the outside diameter of the upper protective wall 71a is smaller than the inside diameter of the lower protective wall 71b. These walls overlap each other slightly when the wafer holder 12 is lowered to the maximum extent, and these walls are arranged to that the over-lapped portions lie one upon another. With this arrangement, when the wafer holder 12 is moved up and down together with the RF electrode, the upper and lower protective walls 71a and 71b move up and down in an overlapped state in accordance with the movement of the RF electrode 15. Furthermore, the upper protective wall 71a is engaged with the chamber wall 7a, and moves up and down as the chamber wall 7a is moved up and down. Further, openings are provided in the protective wall 7b at locations corresponding to the insertion port of the second reaction gas introducing pipe 9, the exhaust port 11 and the wafer carrying-in/carrying-out port 17 of the chamber wall 7a.

This protective wall 7b prevents reaction products produced by the reaction of the reaction gas from adhering to the inner wall of the chamber 7a. Instead, the reaction products adhere to the inner surface of the protective wall 7b.

Figure 5:
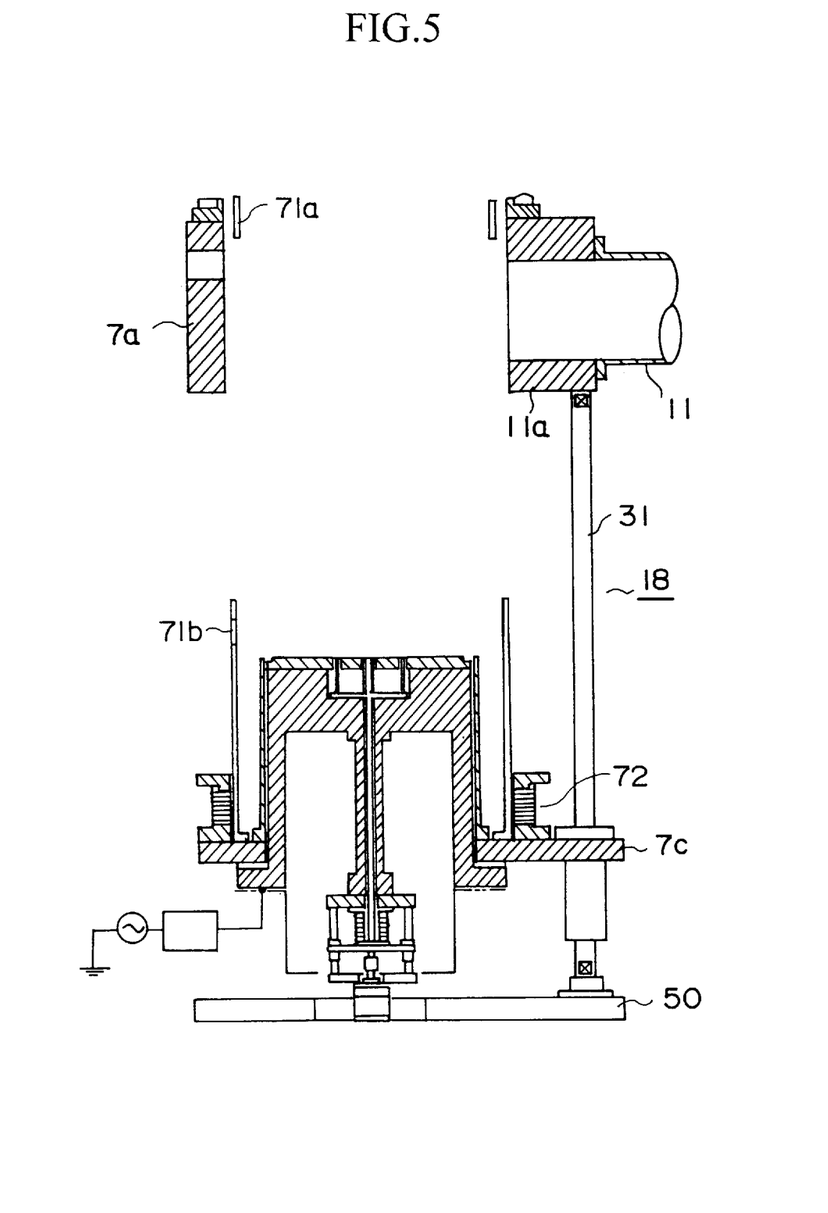
FIG. 5 is a sectional side view illustrating removal of a protective wall according to an embodiment of the present invention.

When the protective wall 7b is cleaned, the pressure inside of the film-forming chamber 7 is returned to atmospheric pressure and the second reaction gas introducing pipe 9 is removed, and thereafter, the chamber wall 7a is moved upward by means of the chamber lift 18 and the upper protective wall 71a and the lower protective wall 71b are removed as shown in FIG. 5. The removed upper protective wall 71a and the lower protective wall 71b are cleaned so as to remove the reaction products that have adhered to their inside surfaces.

It is possible to continue to form a film in the CVD apparatus by setting another protective wall in place of the removed protective wall 7b. In this manner, it is not necessary to suspend operation of the CVD apparatus over a long period of time for cleaning the inside surfaces of the film-forming chamber 7, thus making it possible to maintain the throughput and to reduce labor and cost required for maintenance.

As occasion demands, it is also possible to perform in-situ cleaning in which an etching gas is introduced into the film-forming chamber 7 so as to etch the reaction products and remove them without taking out the protective walls 71a and 71b. In this manner, it is possible to prevent the chamber wall 7a from being damaged by etching. Further, it is possible to accelerate etching so as to increase the effect of the in-situ cleaning by providing heating means around the chamber 7 and heating the protective walls 71a and 71b during cleaning.

Figure 1B:
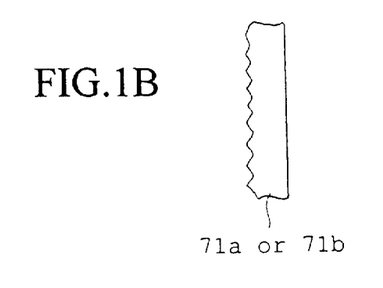
FIG. 1B is a sectional view of a protective wall of a CVD apparatus using plasma in a helicon mode according to an embodiment of the present invention.
Figure 1C:
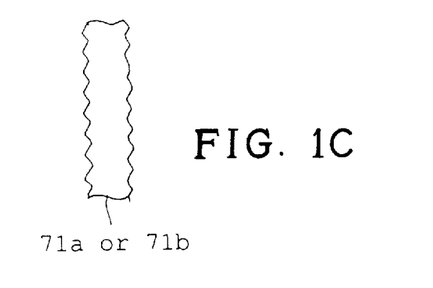
FIG. 1C is a sectional view of a protective wall of a CVD apparatus using plasma in a helicon mode according to another embodiment of the present invention.

Further, in order to increase the adhesion of the reaction products to the protective walls 71a and 71b so that the adhering reaction products do not peel off prior to their replacement, the protective walls 71a and 71b may have uneven surfaces so as to enlarge the contact area for the reaction products as shown in FIG. 1B.

Figure 6:
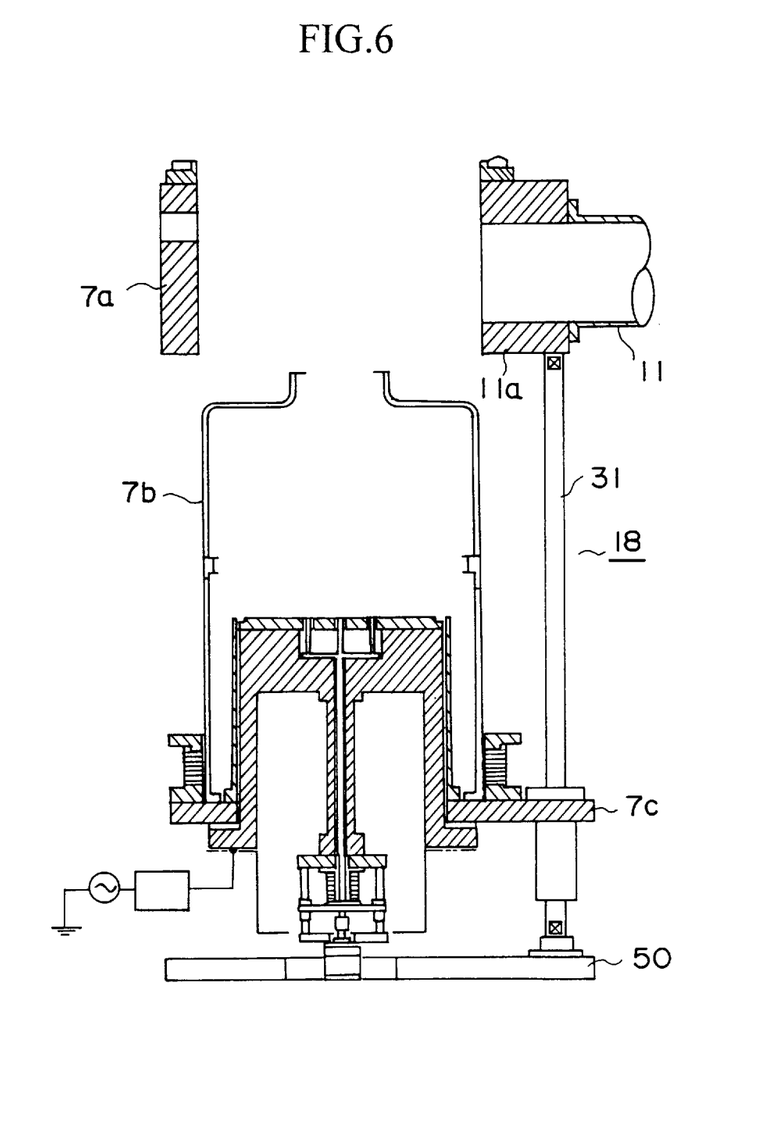
FIG. 6 is a sectional view showing a protective wall according to another embodiment of the present invention.

Furthermore, while protective wall 7b is divided into the upper protective wall 71a and the lower protective wall 71b in the foregoing embodiment, a wall formed as one body may also be used as the protective wall 7b as shown in FIG. 6, when the wafer holder 12 is not required to be moved up and down or when the holder 12 is capable of moving up and down independently of the RF electrode 15.

(D) The chamber lift

FIG. 4 is a side view showing the details of a chamber lift according to an embodiment of the present invention.

In FIG. 4, 31 represents a ball screw (a support shaft) for supporting an exhaust port flange 11 through a bearing support 32, and a spiral thread running around the shaft is formed on the ball screw 31. Further, 33 represents a ball nut (supporting the wafer holder base) which is fitted to the seal portion 7c of the chamber wall 7a, and which is threaded on the ball screw 31 so as to support the ball screw 31. As the ball screw 31 is rotated it moves up and down.

A 5-phase stepping motor 34 (driving means) is connected to the ball screw 31 through a helical coupling 35. The helical coupling 35 transmits the torque of the stepping motor 34 to the ball screw 31 through two helical gears engaged with each other.

The ball screw 31 is rotated by means of the stepping motor 34, to thereby move the chamber wall 7a up and down through the exhaust port flange 11a and is operated when the heavy chamber 7a is opened and closed for the purpose of replacing the protective wall 7b.

While the present invention is applied to a CVD apparatus in the above-described embodiment, it is also applicable to etching apparatus.

Further, while the wafer holder 12 is shown on the RF electrode 15, it may also be installed on one of opposing RF electrodes for exposure to the reaction gas.

(2) Method of forming a film using a CVD apparatus

Next, the operation of the above-mentioned CVD apparatus will be described briefly with reference to FIG. 1A.

First, the wafer (substrate) 20 is placed on the wafer holder 12 and fixed electrostatically by the electrostatic chuck, and the pressure in the film-forming portion 7 is thereafter reduced. As occasion demands, electric power is applied to the heater coil 23 contained in the wafer holder 12 so as to heat the wafer 20, thus maintaining the wafer at a temperature of approximately 200° to 500° C. Further, electric power having a frequency of 13.56 MHz or 100 KHz is supplied to the RF electrode 15, to thereby apply a negative self-bias D.C. voltage to the wafer 20 through the wafer holder 12. In this manner, the film properties such as the density and the stress within the formed film are optimized.

Then, oxygen ($O_2$) gas or a mixed gas of $O_2$+Ar is introduced into the evacuated plasma generating chamber 1. Electric power at a frequency of 13.56 MHz is supplied to the external antenna 2 by means of the RF power source 4 through the matching network 3. With this arrangement, an RF current passing around the plasma generating chamber 1 is applied to the two ring-shaped conductors of the external antenna 2 in opposite directions, respectively, to thereby produce electromagnetic radiation. Furthermore, an electric current is supplied to the inside source solenoid 5 and the outside source solenoid 6 so as to generate an axial magnetic force.

Thus, a helicon wave is produced, the oxygen gas in the plasma generating portion 1 is activated, and plasma of high density ($10^{12}$ cm$^{-3}$ or higher) in a helicon mode is generated.

The generated plasma moves downstream to the evacuated film-forming chamber 7 by the magnetic field and activates the $SiH_4$ gas supplied onto the wafer 20. Thus, the activated $SiH_4$ gas reacts with the oxygen plasma, and a silicon oxide film is accumulated on the wafer 20.

In the CVD apparatus described above, the external antenna 2 connected with the RF power source 4 supplies the RF power at a frequency of 13.56 MHz, to thereby generate the plasma. Thus, the equipment such as a waveguide required in the case of the ECR method is not required, and the apparatus structure becomes simpler. Further, since it is possible to use a frequency lower than the frequency of 2.45 GHz in the case of the ECR method, it is easy to generate high frequency electric power.

Further, since the first reaction gas introducing pipe 8 for introducing the oxygen gas and the second reaction gas introducing pipe 9 for introducing the $SiH_4$ gas are separated from each other, the reaction between the reaction gases during supply is restricted, and generation of particles is reduced. All of the gas may be introduced through the first reaction gas introducing pipe 8 if circumstances require.

As described above, the electrode 22 of the electrostatic chuck and the heating means 23 are formed in the base insulator 21 of the substrate holder according to the present invention. Thus, only the base 21 of the substrate holder 12 or the electrode 22 of the electrostatic chuck lies between the held substrate 20 and the heating means 23. As a result, it is possible to reduce power consumption for heating the substrate, and to change the substrate temperature in a short period of time.

Further, the processing chamber 7 has a double wall structure composed of the chamber wall 7a and the protective wall 7b, thus making it possible to remove the protective wall 7b separately from the chamber 7a and to replace it.

Accordingly, when reaction products have adhered to the inner wall of the processing chamber 7, the protective wall 7b is taken out by removing the chamber wall 7a, and the protective wall 7b is cleaned so as to remove the reaction products from the inner surface thereof. In this case, it is possible to continue processing in the manufacturing apparatus during cleaning of the protective wall as mentioned previously by setting another protective wall in place of the removed protective wall 7b. With this procedure, it is not necessary to suspend operation of the apparatus for many hours of cleaning, thus making it possible to maintain throughput and to reduce the labor and cost required for maintenance.

What is claimed is:

1. A reaction apparatus comprising:
    a chamber wall enclosing a processing chamber for processing a solid substrate with a gas;
    heating means for heating said substrate;
    an electrode for electrostatically attracting the substrate;
    a substrate holder mounted within the processing chamber for releasibly holding the substrate, said substrate holder including one base element, said heating means and said electrode being within said one base element; and
    axially overlapping upper and lower protective walls mounted between said chamber wall and said substrate holder, said upper and lower protective walls being independently movable.

2. A reaction apparatus according to claim 1, wherein at least one of said upper and lower protective walls is removable.

3. A reaction apparatus according to claim 1, wherein at least one of said upper and lower protective walls has an uneven inner surface.

4. A reaction apparatus according to claim 1 further comprising a support electrode, supporting said substrate holder, for generating an A.C. electric signal to activate the gas or to bias the held substrate.

5. A reaction apparatus according to claim 1 which is a CVD apparatus further comprising means for generating a plasma in a helicon mode.

6. A reaction apparatus comprising:
    a chamber wall enclosing a processing chamber for processing a solid substrate with a gas;
    heating means for heating said substrate;
    an electrode for electrostatically attracting the substrate;
    a substrate holder mounted within the processing chamber for releasibly holding the substrate, said substrate holder including one base element, said heating means and said electrode being within said one base element; and
    elevating means for raising and lowering said chamber wall, said elevating means including:
        a threaded support shaft supporting said chamber wall;
        a support base including a threaded hole through which said support shaft extends for up and down movement relative thereto, as said support shaft is rotated; and
        drive means for rotating said support shaft.

7. A reaction apparatus according to claim 6 further comprising a support electrode, supporting said substrate holder, for generating an A.C. electric signal to activate the gas or to bias the held substrate.

8. A reaction apparatus according to claim 6 which is a CVD apparatus further comprising means for generating a plasma in a helicon mode.

9. A reaction apparatus according to claim 6 further comprising a protective wall interposed between said chamber wall and said substrate holder for protecting an inside surface of said chamber wall against adhesion of products produced by reaction of the gas and wherein said chamber wall is moved by said elevating means relative to said protective wall to allow for removal of said protective wall for cleaning.

10. A reaction apparatus comprising:

a chamber wall enclosing a processing chamber for processing a solid substrate with a gas;

a substrate holder mounted within the processing chamber for releasibly holding the substrate; and axially overlapping upper and lower protective walls mounted between said chamber wall and said substrate holder for protecting an interior surface of said chamber wall against adhesion of products of reaction of the gas, said upper and lower protective walls being independently movable.

11. A reaction apparatus according to claim 10 wherein at least one of said upper and lower protective walls has an uneven interior surface.

12. A reaction apparatus according to claim 10 further comprising elevating means for raising and lowering said chamber wall.

13. A reaction apparatus according to claim 12 wherein said elevating means comprises:

a threaded support shaft supporting said chamber wall;

a support base including a threaded hole through which said support shaft extends for up and down movement relative thereto, as said support shaft is rotated; and drive means for rotating said support shaft.

14. A reaction apparatus comprising:

a chamber wall enclosing a processing chamber for processing a solid substrate with a gas;

a substrate holder mounted within the processing chamber for releasibly holding the substrate;

a protective wall interposed between said chamber wall and said substrate holder for protecting an interior surface of said chamber wall against adhesion of products of reaction of the gas; and elevating means for raising and lowering said chamber wall, said elevating means including:

a threaded support shaft supporting said chamber wall;

a support base with a threaded hole in which said support shaft is threadably engaged, said support shaft moving relative to said support base as it is rotated; and drive means for rotating said support shaft.

15. A reaction apparatus according to claim 14 further comprising a support electrode for generating an A.C. electric signal to activate the gas or to bias the held substrate.

16. A reaction apparatus according to claim 14 which is a CVD apparatus further comprising means for generating a plasma in a helicon mode.

* * * * *

UNITED STATES PATENT AND TRADEMARK OFFICE
CERTIFICATE OF CORRECTION

PATENT NO. : 5,858,100
DATED : January 12, 1999
INVENTOR(S) : MAEDA et al

It is certified that error appears in the above-indentified patent and that said Letters Patent is hereby corrected as shown below:

On the title page, item: [73] Assignees: Semiconductor Process Co., Ltd." should read --[73] Assignees: Semiconductor Process Laboratory Co., Ltd.--;

ON THE FACE OF THE PATENT, Under the Heading, "U.S. Patent Documents", "5,084,125   1/1992   Nobuo et al" should read --5,084,125   1/1992   Nobuo et al   118/719--.

Col. 1, line 35, "active" should read --activate--; and
        line 65, "mans" should read --means--.

Col. 7, line 45, delete "he" and insert --Further, the--; and
        line 53, "to" should read --so--.

Signed and Sealed this

Thirtieth Day of November, 1999

Attest:

Q. TODD DICKINSON

*Attesting Officer*  *Acting Commissioner of Patents and Trademarks*